United States Patent
Jeon et al.

(10) Patent No.: US 9,835,681 B2
(45) Date of Patent: Dec. 5, 2017

(54) PROBE CARD INCLUDING WIRELESS INTERFACE AND TEST SYSTEM INCLUDING THE SAME

(71) Applicant: Samsung Electronics Co., Ltd., Suwon-si, Gyeonggi-do (KR)

(72) Inventors: Kyoung-hoon Jeon, Hwaseong-si (KR); Yo-jong Kim, Yongin-si (KR); Kyu-jeong Lee, Hwaseong-si-si (KR); Il-kyo Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 414 days.

(21) Appl. No.: 14/574,723

(22) Filed: Dec. 18, 2014

(65) Prior Publication Data
US 2015/0219688 A1   Aug. 6, 2015

(30) Foreign Application Priority Data
Feb. 5, 2014   (KR) .................. 10-2014-0013319

(51) Int. Cl.
| | |
|---|---|
| *G01R 31/302* | (2006.01) |
| *G01R 31/308* | (2006.01) |
| *G01R 31/27* | (2006.01) |
| G01R 31/26 | (2014.01) |
| G06F 19/00 | (2011.01) |

(52) U.S. Cl.
CPC ......... *G01R 31/3025* (2013.01); *G01R 31/27* (2013.01); *G01R 31/308* (2013.01); *G01R 31/26* (2013.01); *G06F 19/00* (2013.01)

(58) Field of Classification Search
CPC .. G01R 31/3025; G01R 31/27; G01R 31/302; G01R 1/06; G01R 31/26; H01L 21/66
See application file for complete search history.

(56) References Cited

U.S. PATENT DOCUMENTS

| | | | |
|---|---|---|---|
| 6,600,325 B2 * | 7/2003 | Coates | G01R 31/3025 324/519 |
| 2003/0146771 A1* | 8/2003 | Moore | G01R 31/2884 324/762.03 |
| 2004/0253818 A1* | 12/2004 | Okamoto | G01N 22/04 438/689 |
| 2006/0066326 A1 | 3/2006 | Slupsky | |
| 2006/0226864 A1* | 10/2006 | Kramer | G01R 31/2822 324/750.15 |
| 2010/0025682 A1 | 2/2010 | Lee et al. | |
| 2012/0239339 A1* | 9/2012 | Kaneko | G01R 31/3025 702/122 |

FOREIGN PATENT DOCUMENTS

KR   1020100015206 A   2/2010

* cited by examiner

*Primary Examiner* — Harry W Byrne
*Assistant Examiner* — Ajay Ojha
(74) *Attorney, Agent, or Firm* — Myers Bigel, P.A.

(57) ABSTRACT

A probe card for testing electrical properties of a device under test (DUT) includes a plurality of semiconductor devices, which includes a substrate; and at least one transmission antenna, which is implemented as a chip on film (COF) type and attached to the substrate, wirelessly transmitting at least one of electric power and data to each of the plurality of semiconductor devices.

16 Claims, 11 Drawing Sheets

PROBE CARD INCLUDING WIRELESS INTERFACE AND TEST SYSTEM INCLUDING THE SAME

CROSS-REFERENCE TO RELATED APPLICATION

This application claims priority under 35 U.S.C. §119 to Korean Patent Application No. 10-2014-0013319, filed on Feb. 5, 2014, in the Korean Intellectual Property Office, the disclosure of which is incorporated herein in its entirety by reference.

BACKGROUND

The inventive concepts relate to a semiconductor apparatus, and more particularly, to a probe card for testing electrical properties of a wafer on which semiconductor devices are formed, and a test system including the probe card.

When semiconductor devices are formed on the wafer via a semiconductor manufacturing process, an electrical property test may be performed on each semiconductor device. The electrical property test is performed using a probe card that applies an electrical signal to the semiconductor devices on the wafer, detects a signal that is output in response to the applied electrical signal, and thus determines whether or not any of the semiconductor devices are faulty.

SUMMARY

According to an aspect of the inventive concepts, there is provided a probe card for testing electrical properties of a device under test (DUT) that includes a plurality of semiconductor devices, the probe card including a substrate; and at least one transmission antenna, which is implemented as a chip on film (COF) type and attached to the substrate. The at least one transmission antenna wirelessly transmits at least one of an electrical power signal and a data signal to each of the semiconductor devices.

A size of the at least one transmission antenna may be determined according to a size of at least one reception antenna on the DUT.

The at least one transmission antenna may comprise a first number of transmission antennas, and each of the plurality of semiconductor devices may include the first number reception antennas.

The at least one transmission antenna may include a tape wiring substrate and at least one coil disposed at a first side of the tape wiring substrate.

A distance adjusting unit may be provided which is connected to a second side of the tape wiring substrate that is opposite the first side. The distance adjusting unit may be configured to adjust a distance between the at least one transmission antenna and the DUT.

The distance adjusting unit may include a plurality of via plugs that are electrically connected to the at least one transmission antenna.

The at least one transmission antenna may be configured to wirelessly transmit at least one of the electrical power signal and the data signal to a plurality of reception antennas that are provided on respective ones of the semiconductor devices.

The size of the at least one coil may be determined based on a size of each of the at least one reception antennas.

A transmission circuit may also be provided on the probe card. The transmission circuit may be implemented as a COF type and attached to the substrate, and may be configured to receive at least one of a test electrical power signal and a test data signal from a tester, perform signal processing on at least one of the received test electrical power signal and the received test data signal to generate at least one of the electrical power signal and the data signal that are wirelessly transmitted by the at least one transmission antenna.

The at least one transmission antenna and the transmission circuit may be implemented as a transmission module.

A probe unit may also be provided on the substrate. The probe unit may include a plurality of probes that are configured to contact respective ones of the plurality of semiconductor devices during an electrical properties test. The probe unit may be configured to receive output signals that are output from respective ones of each of the semiconductor devices in response to at least one of the electrical power signal and the data signal.

A first of the probes may be configured to contact a chip pad on a first of the plurality of semiconductor devices to transmit at least one of the electrical power signal and the data signal to the first of the plurality of semiconductor devices.

According to another aspect of the inventive concept, there is provided a test system including a tester that is configured to provide at least one of a test electrical power signal and a test data signal to a probe card for testing electrical properties of a device under test (DUT) that includes a plurality of semiconductor devices. The probe card may be configured to transmit at least one of an electrical power signal and a data signal to each of the plurality of semiconductor devices in response to receiving at least one of the test electrical power signal and the test data signal from the tester. The probe card includes a substrate; and at least one transmission antenna, which is implemented as a chip on film (COF) type and attached to the substrate. The at least one transmission antenna may be used to wirelessly transmit at least one of the electrical power signal and the data signal to each of the plurality of semiconductor devices.

The at least one transmission antenna may include a tape wiring substrate; and at least one coil disposed at a first side of the tape wiring substrate.

The probe card may further include a probe unit that is provided on the substrate, and the probe unit may include a plurality of probes that are configured to contact each of the plurality of semiconductor devices and to receive output signals that are output from each of the plurality of semiconductor devices in response to at least one of the electrical power signal and the data signal.

According to another aspect of the inventive concept, there is provided a probe card for testing electrical properties of a device under test that includes a plurality of semiconductor devices that each include at least one reception antenna. The probe card includes a substrate and at least one chip on film type transmission antenna that is mounted on the substrate, the at least one chip on film transmission antenna configured to wirelessly transmit at least one of an electrical power signal and a data signal to the at least one reception antenna included on each of the plurality of semiconductor device. The probe card further includes a plurality of probes that are connected to the substrate and that are configured to contact respective ones of the plurality of semiconductor devices during an electrical properties test. Each of the at least one chip on film transmission antennas is substantially the same size as each of the at least one reception antennas.

The at least one chip on film transmission antennas may comprise a first number of chip on film transmission antennas that is at least two chip on film transmission antennas, and the at least one reception antennas included on each of the semiconductor devices may comprise the first number of reception antennas.

The at least one chip on film transmission antenna may include a tape wiring substrate and at least one coil disposed at a first side of the tape wiring substrate. The tape wiring substrate may comprise an insulative base film, a wiring pattern on the base film, a protective film on the wiring pattern, and the at least one coil electrically connected to the wiring pattern.

The at least one reception antennas may be located in scribe lines of the wafer

The probe card may further include a moveable distance adjusting unit, and the at least one chip on film transmission antenna may be mounted on the distance adjusting unit.

According to another aspect of the inventive concept, methods of performing an electrical properties test are provided in which a wafer having a plurality of semiconductor devices thereon is provided. A first test signal is transmitted over a wired connection to a first of the semiconductor devices. A second test signal is wirelessly transmitted to the first of the semiconductor devices. First test data is received from the first of the semiconductor devices over the wired connection in response to the first test signal. Second test data is wirelessly received from the first of the semiconductor devices in response to the second test signal.

A first test that is associated with the first test signal and a second test that is associated with the second test signal may be performed at least partially at the same time.

The first test signal and the second test signal may be transmitted to the first semiconductor device from a probe card.

The probe card may include at least one transmission antenna and the first of the semiconductor devices may include at least one reception antenna.

The at least one reception antenna may be located on a scribe line of the wafer and may be electrically connected to the first of the semiconductor devices.

The at least one transmission antenna may be a chip on film (COF) type antenna that is mounted on a substrate.

The at least one transmission antenna may be configured to wirelessly transmit at least one of an electrical power signal and a data signal to each of the plurality of semiconductor devices.

A size of the at least one transmission antenna may be determined based on a size of at least one reception antenna on the first of the semiconductor devices.

A size of the at least one transmission antenna may be substantially the same as the size of at least one reception antenna on the first of the semiconductor devices.

The at least one transmission antenna may comprise a first number of transmission antennas, and the at least one reception antenna on the first of the plurality of semiconductor devices may comprise the first number of reception antennas The at least one transmission antenna may comprise a tape wiring substrate and at least one coil disposed at a first side of the tape wiring substrate A distance between the at least one transmission antenna and the wafer may be adjusted using a distance adjustment unit that is connected to a second side of the tape wiring substrate that is opposite the first side.

A first test that is associated with the first test signal and a second test that is associated with the second test signal may be performed simultaneously.

Transmitting the first test signal over the wired connection to the first of the semiconductor devices may comprise contacting a probe of a probe unit to a chip pad on the first of the semiconductor devices and transmitting the first test signal to the first of the semiconductor devices via the probe Wirelessly transmitting a second test signal to the first of the semiconductor devices may comprise wirelessly transmitting the second test signal from at least one transmission antenna of a probe card that includes the probe unit to a reception antenna that is associated with the first of the semiconductor devices

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF THE EMBODIMENTS

Figure 1:
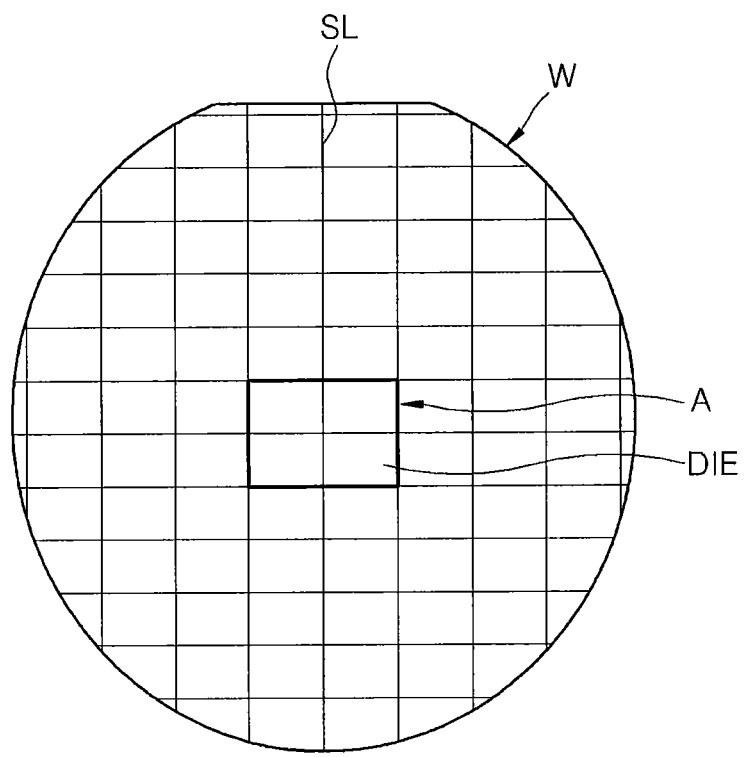
FIG. 1 is a schematic plan view of a wafer on which a plurality of semiconductor devices are formed.

The inventive concepts will now be described more fully with reference to the accompanying drawings, in which exemplary embodiments of the inventive concepts are shown. The embodiments are provided so that this disclosure will be thorough and complete, and will fully convey the inventive concepts to those skilled in the art. As the inventive concepts allows for various changes and numerous embodiments, particular embodiments will be illustrated in the drawings and described in detail in the written description. However, this is not intended to limit the inventive concepts to particular modes of practice, and it is to be appreciated that all changes, equivalents, and substitutes that do not depart from the spirit and technical scope of the inventive concepts are encompassed in the present inventive concepts. Like reference numerals in the drawings denote like elements. In the drawings, sizes of components may be exaggerated for clarity.

The terms used in the present specification are merely used to describe particular embodiments, and are not intended to limit the inventive concepts. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components must not be limited to the above terms. The above terms are used only to distinguish one component from another. For example, within the scope of the inventive concepts, a "first element" may be referred to as a "second element," and vice versa.

Unless defined otherwise, all terms used in the description including technical or scientific terms have the same meaning as generally understood by one of ordinary skill in the art. It will be further understood that terms, such as those defined in commonly used dictionaries, should be interpreted as having a meaning that is consistent with their meaning in the context of the related art, and should not be interpreted as having ideal or excessively formal meanings unless it is clearly defined in the specification. Expressions such as "at least one of," when preceding a list of elements, modify the entire list of elements and do not modify the individual elements of the list.

Figure 2:
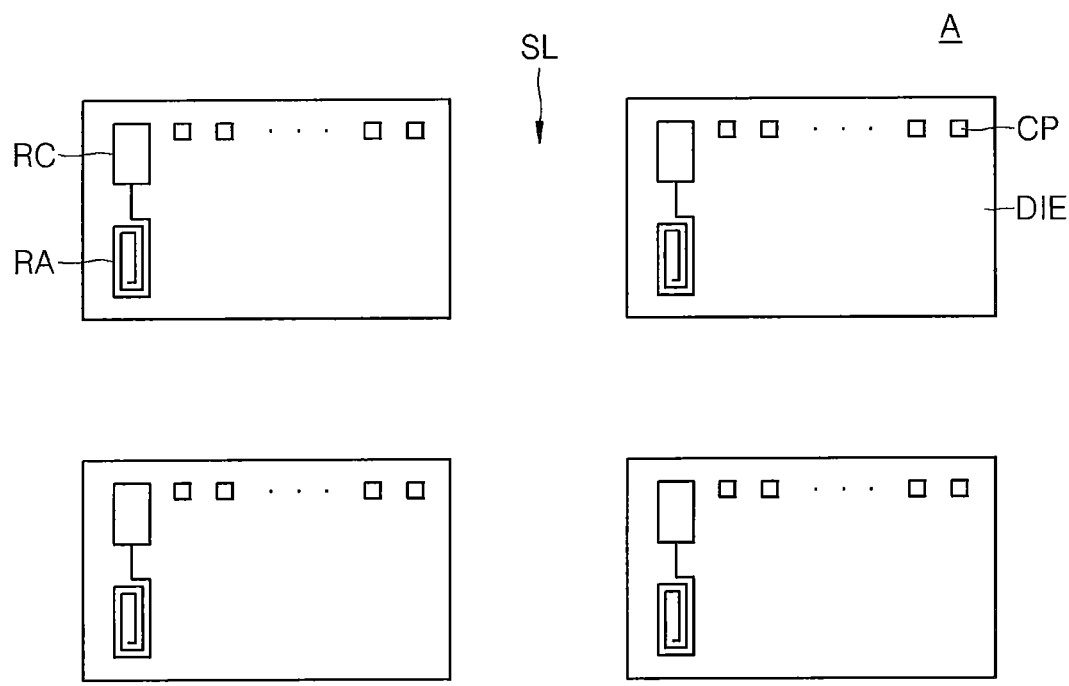
FIG. 2 is an enlarged plan view of a portion A of FIG. 1, according to an aspect of the inventive concepts.

FIG. 1 is a schematic plan view of a wafer W on which a plurality of semiconductor devices are formed. FIG. 2 is an enlarged plan view of a portion A of FIG. 1, according to an aspect of the inventive concepts.

Referring to FIGS. 1 and 2, a plurality of semiconductor devices DIE are formed on the wafer W using a fabrication (FAB) process. The semiconductor devices DIE are separated by scribe lines SL and manufactured as independent units of chips based on an assembly process.

After completion of the FAB process and prior to the assembly process, a test procedure may be performed for testing various electrical properties of the semiconductor devices DIE that are formed on the wafer W. This test procedure may comprise, for example, an electrical die sorting (EDS) process. Hereinafter, the EDS process will be described in detail. However, the inventive concepts are not limited to use in an EDS process, and other tests for testing whether the semiconductor devices DIE are faulty may also be applied using the techniques disclosed herein.

During the EDS process, an electrical signal is applied to the semiconductor devices DIE that are formed on the wafer W. In response to this signal, the semiconductor devices DIE transmit output signals. These output signals are used to determine if one or more of the semiconductor devices DIE are faulty. In the EDS process, a tester generates one or more electrical signals, i.e., an electrical power signal and a data signal, and transmits this electric signal to the semiconductor devices DIE via a probe card. The probe card may transmit the electrical signal by a wired or wireless connection to the semiconductor devices DIE. In other words, the EDS process may be executed by a wired connection or by a wireless connection.

In a wired EDS process, an electrical signal is applied to a plurality of chip pads CP, which are disposed along peripheries of the semiconductor devices DIE that are formed on the wafer W. A determination is then made as to whether or not the semiconductor devices DIE are faulty based on output signals that are output from the semiconductor devices DIE in response to the applied electrical signal. In a wireless EDS process, an electrical signal is transmitted to at least one reception antenna RA that is disposed on each of the semiconductor devices DIE formed on the wafer W. A determination is then made as to whether or not the semiconductor devices DIE are faulty based on output signals that are output from the semiconductor devices DIE in response to the received electrical signal.

In the present embodiment, each of the semiconductor devices DIE may include a reception antenna RA, a reception circuit RC and a plurality of chip pads CP. Although FIG. 2 illustrates the plurality of chip pads CP as being disposed in a single line along a side of each semiconductor device DIE, the inventive concepts are not limited thereto. For example, in other embodiments, the chip pads CP may be disposed in a single line or a plurality of lines along two or more sides of each semiconductor device DIE. In still other embodiments, the chip pads CP may be disposed in a single line or a plurality of lines at one or more corners of each semiconductor device DIE. In still other embodiments, the chip pads CP may be disposed in a single line or a plurality of lines in the center of each semiconductor device DIE. Numerous other configurations are possible.

During the EDS process, the reception antenna RA on each semiconductor device DIE may wirelessly receive the electrical signal, i.e., at least one of an electrical power signal and a data signal, from the probe card. The reception antenna RA may be very small, for example, a size of about tens to hundreds of microns. Since the reception antennas RA may be built in each semiconductor device DIE, the reception antennas RA may be referred to as on-chip antennas. More than one reception antenna RA may be formed on each semiconductor device DIE. The number of reception antennas RA may be determined according to a desired inductance such as, for example, a required inductance.

The reception circuit RC on a particular one of the semiconductor devices DIE may process the electrical signal, i.e., at least one of the electrical power signal and the data signal, that is received from the reception antenna RA, and provide the processed electrical signal to the semiconductor device DIE. The reception circuit RC will be described below with reference to FIG. 5.

At least one of the chip pads CP on the semiconductor device DIE may be contacted a probe, a probe needle, or a probing pin of the probe card during the EDS process, and receive the electrical signal, i.e., at least one of the electrical power signal and the data signal, from the probe card over a wired connection. Also, at least one of the chip pads CP may transmit output signals that are output from the semiconductor device DIE in response to the received electrical signal, i.e., the electrical power signal and the data signal, to the probe card.

Therefore, according to the present embodiment, it is possible to simultaneously execute a wired test by using at least one of the chip pads CP, and a wireless test by using the reception antenna RA. Also, by using at least one of the chip pads CP, it is possible to verify whether the reception antenna RA is normally receiving the electrical power signal and/or the data signal.

Due to improvements in semiconductor device manufacturing technology, semiconductor devices are being reduced in size, and accordingly, the sizes of semiconductor packages are also decreasing. As a result, the sizes of chip pads or I/O pads and the intervals between chip pads or I/O pads in each semiconductor device are being reduced. Chip pads that are reduced in size may exhibit reduced physical durability. When performing a test on a semiconductor device, chip pads may be damaged due to contact between probes on a probe card and the chip pads.

However, according to the present embodiment, since a reception antenna RA is built into each semiconductor device DIE, it is possible to wirelessly receive at least one of the electrical power signal and the data signal from the probe card when performing a test on the semiconductor devices DIE, and thus, the chip pads CP are less likely to be damaged.

Figure 3:
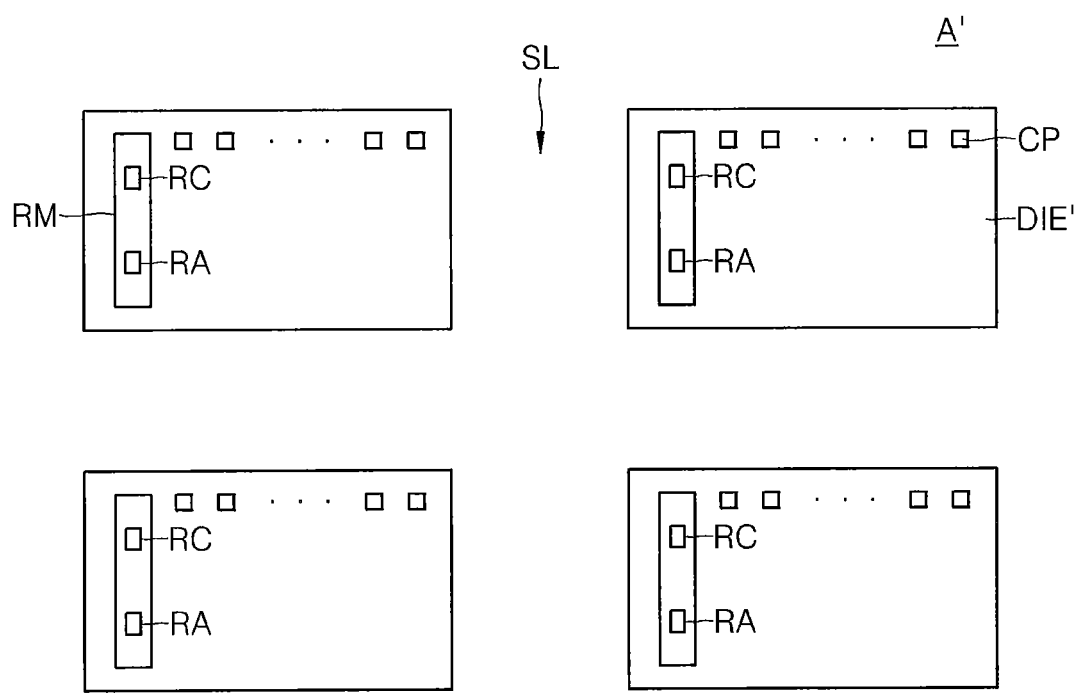
FIG. 3 is an enlarged plan view of a modified example of the portion A of FIG. 1, according to another aspect of the inventive concepts.

FIG. 3 is an enlarged plan view of a modified example A' of the portion A of FIG. 1, according to another aspect of the inventive concepts.

Referring to FIG. 3, a plurality of semiconductor devices DIE' may each include a reception module RM and a plurality of chip pads CP. Some elements included in the semiconductor devices DIE' according to the present embodiment are substantially the same as elements included in the semiconductor devices DIE of FIG. 2. Like elements are denoted using like reference numerals, and a description of elements that are the same as those of the semiconductor devices DIE of FIG. 2 will not be repeated. Hereinafter, a difference between the semiconductor devices DIE of FIG. 2 and the semiconductor devices DIE' according to the present embodiment will be described.

According to the present embodiment, the reception module RM may include the reception antenna RA and the reception circuit RC. The reception antenna RA may comprise a single reception antenna RA or a plurality of reception antennas RA, and the number of reception antennas RA may be determined according to a desired inductance.

By implementing the reception antenna RA and the reception circuit RC as the reception module RM, the reception module RM may be inserted in desired locations in each semiconductor device DIE'. The detailed structure of an embodiment of the reception module RM will be described below with reference to FIG. 5.

Figure 4:
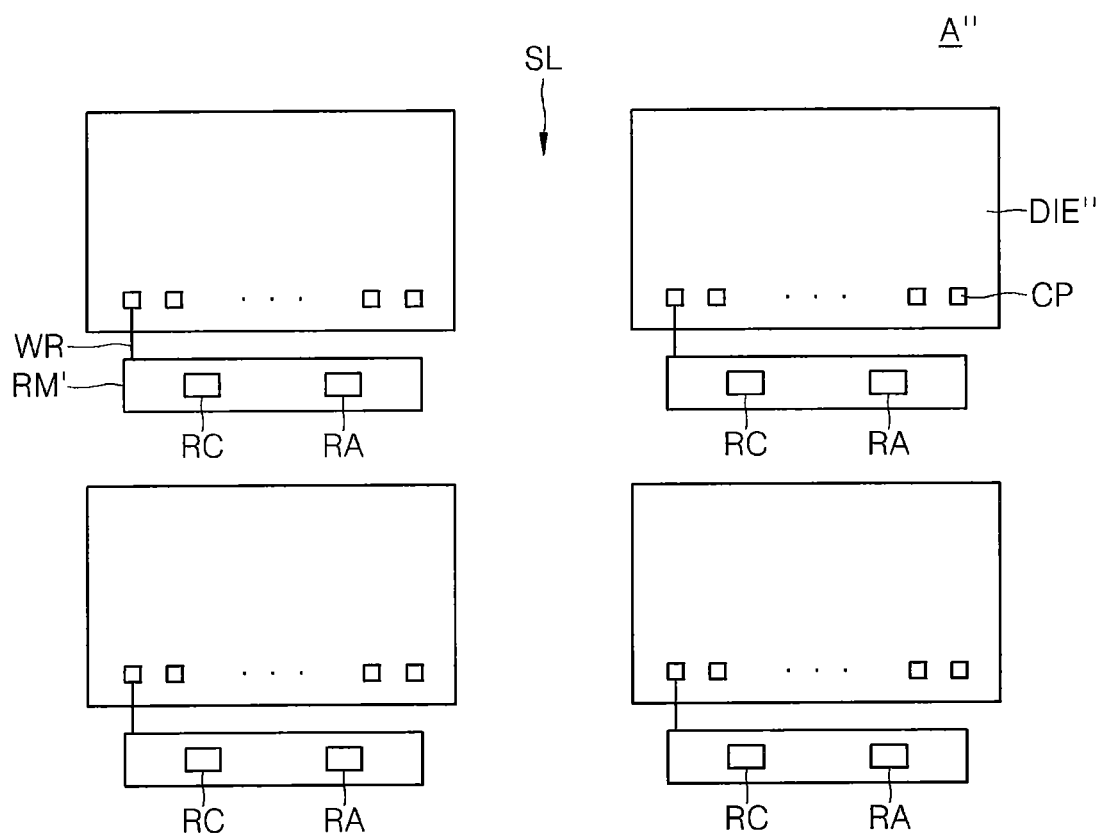
FIG. 4 is an enlarged plan view of another modified example of the portion A of FIG. 1, according to another aspect of the inventive concepts.

FIG. 4 is an enlarged plan view of another modified example A'' of the portion A of FIG. 1, according to another aspect of the inventive concepts.

Referring to FIG. 4, a plurality of semiconductor devices DIE'' may each include a plurality of chip pads CP. A reception module RM' that corresponds to each semiconductor device DIE'' may be disposed on the scribe lines SL. The reception module RM' may be electrically connected to one or more of the chip pads CP via one or more wires WR. Some elements included in the semiconductor devices DIE'' according to the present embodiment are substantially the same as the elements included in the semiconductor devices DIE of FIG. 2 or the semiconductor devices DIE' of FIG. 3. Like elements are denoted using like reference numerals, and a description of elements that are the same as those of the semiconductor devices DIE of FIG. 2 or the semiconductor devices DIE' of FIG. 3 will not be repeated. Hereinafter, a difference between the semiconductor devices DIE of FIG. 2 or the semiconductor devices DIE' of FIG. 3 and the semiconductor devices DIE'' according to the present embodiment will be described.

According to the present embodiment, the reception module RM' may include the reception antenna RA and the reception circuit RC. Although a single reception antenna RA is illustrated in the drawing, the present embodiment is not limited thereto. The reception antenna RA may comprise a plurality of reception antennas RA, and the number of reception antennas RA may be determined according to a desired inductance.

Therefore, by implementing the reception antenna RA and the reception circuit RC as the reception module RM', the reception module RM' may be inserted in the scribe lines SL between the semiconductor devices DIE''. Accordingly, a size of each semiconductor device DIE'' is not increased even if the reception module RM' is added. Thus, it is possible to reduce a size of each semiconductor chip. Also, during the assembly process that is executed after the EDS process, the reception module RM' may be removed by sawing.

Figure 5:
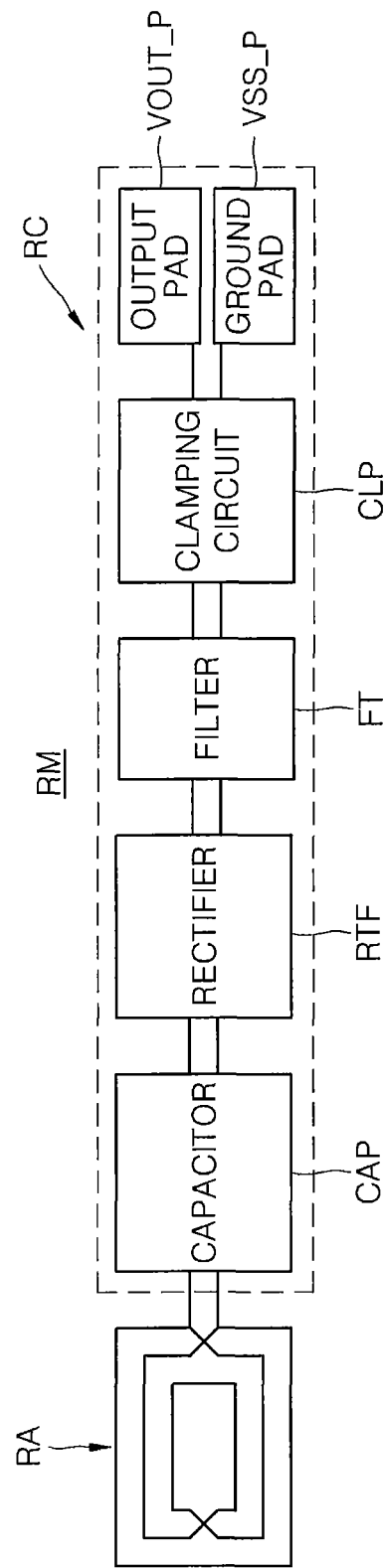
FIG. 5 is a schematic block diagram of an example of a reception module of FIG. 3.

FIG. 5 is a schematic block diagram of an example embodiment of the reception module RM in FIG. 3.

Referring to FIG. 5, the reception module RM may include the reception antenna RA and the reception circuit RC. The reception circuit RC may include a capacitor CAP, a rectifier RTF, a filter FT, a clamping circuit CMP, an output pad VOUT_P and a ground pad VSS_P. The reception module RM' that is included in FIG. 4 may be substantially similar to the reception module RM.

The reception antenna RA may comprise, for example, a polygonal or circular coil. A shape and a size of the reception antenna RA may be determined based on not only a space in which the reception antenna RA is provided, but also on a desired inductance of the reception antenna RA. For example, the size of the reception antenna RA may be about 1000 μm×about 50 μm. Also, the reception antenna RA may comprise a plurality of reception antennas RA, and the number of reception antennas RA may vary according to a desired inductance.

Since the elements included in the reception circuit RC are similar to elements of a general reception circuit, a detailed description of the reception circuit RC will be omitted. For example, the rectifier RTF may have a size of about 180 μm×about 50 μm, the filter FT may have a size of about 50 μm×about 50 μm, and the clamping circuit CLP may have a size of about 120 μm×about 50 μm, and the output pad VOUT_P and the ground pad VSS_P may each have a size of about 40 μm×about 40 μm, in an example embodiment.

Accordingly, by implementing the reception antenna RA and the reception circuit RC as a small reception module RM, the small reception module RM may be inserted in each semiconductor device DIE or a location nearby each semiconductor device DIE.

Figure 6:
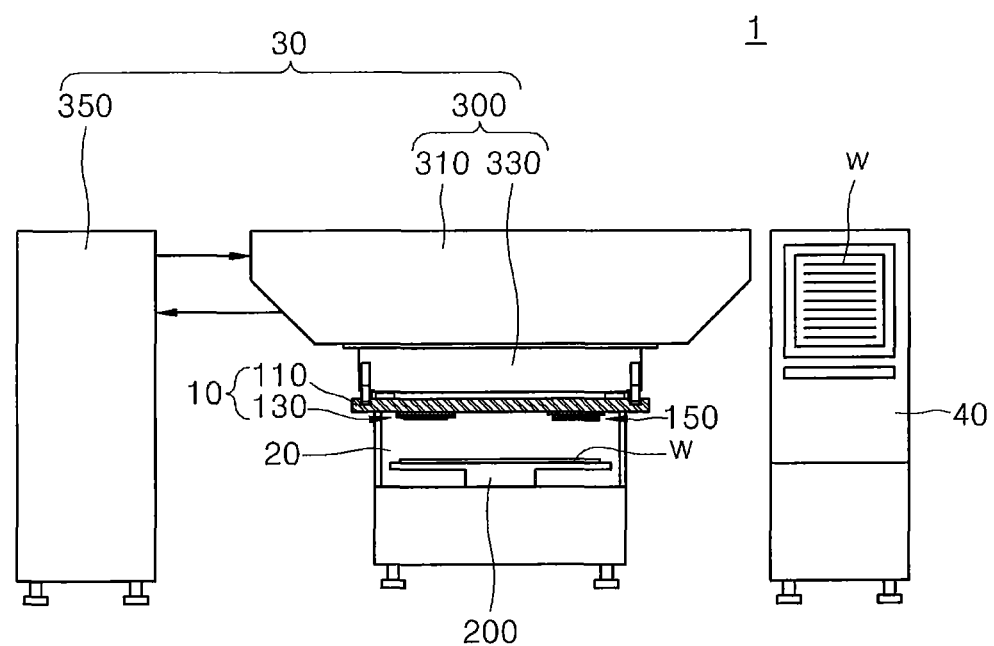
FIG. 6 is a view of a test system according to an aspect of the inventive concepts.
Figure 7:
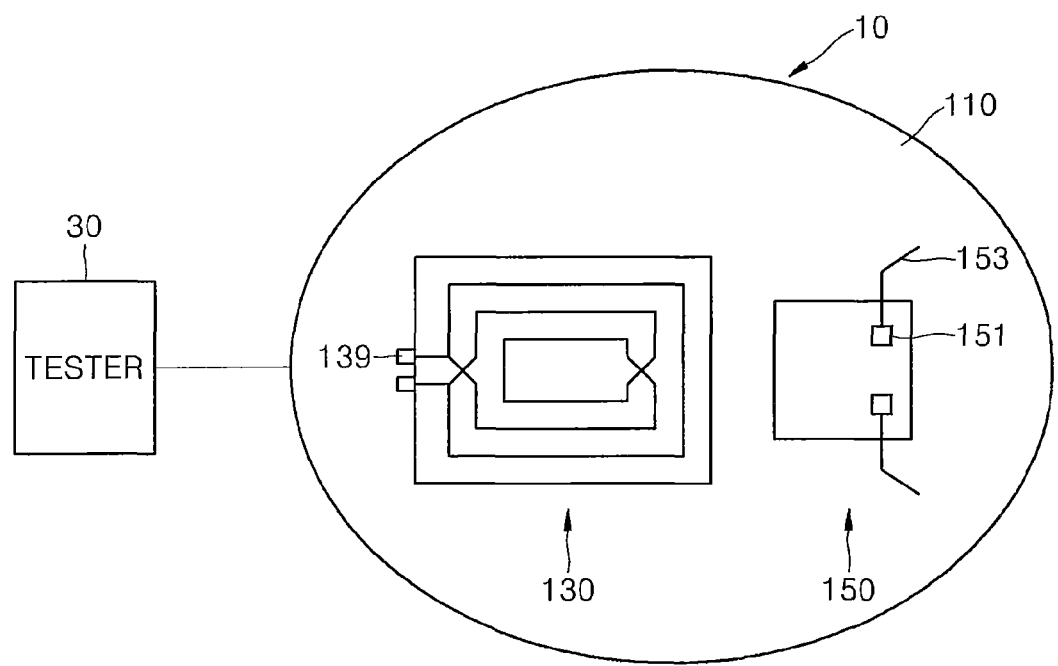
FIG. 7 is a schematic plan view of a probe card that is included in the test system of FIG. 6.

FIG. 6 is a view of a test system 1 according to an aspect of the inventive concepts, and FIG. 7 is a schematic plan view of a probe card 10 that is included in the test system of FIG. 6, according to an aspect of the inventive concepts.

Referring to FIGS. 6 and 7, the test system 1 may include the probe card 10, a test chamber 20, a tester 30, and a loader chamber 40. The tester 30 includes a test head 300 and a test body 350, which are electrically connected via wires. Hereinafter, elements in the test system 1 will be described in detail with reference to FIGS. 1, 2, 6, and 7.

The probe card 10 may include a substrate 110, at least one transmission antenna 130, and a probe unit 150. Since the size of each semiconductor device DIE formed on the wafer W is small, it may be difficult to directly connect the tester 30 that generates electrical signals to each semiconductor device DIE. Therefore, the probe card 10 is used as a medium between the tester 30 that generates the electrical signals and the wafer W on which each semiconductor device DIE is formed.

Referring to FIG. 7, the substrate 110 is shaped as a circular plate, and a plurality of male or female connectors may be formed on an upper surface of the substrate 110 in a circumferential direction of the substrate 110. By using the plurality of male or female connectors, the probe card 10 may be connected to the test head 300. For example, the substrate 110 may be a printed circuit board (PCB). Also, the substrate 110 may be referred to as a main circuit board.

The at least one transmission antenna 130 may be implemented as a chip-on film (COF) type antenna that is attached to a side of the substrate 110, and may wirelessly transmit an electrical signal, i.e., at least one of the electrical power signal and the data signal, that is received from the tester 30 to the reception antenna RA on each semiconductor device DIE. The at least one transmission antenna 130 may comprise a plurality of transmission antennas 130, where the number of transmission antennas 130 may be determined according to the number of reception antennas RA that correspond to each semiconductor device DIE.

A size of each transmission antenna 130 may, for example, be substantially similar to the size of the reception antennas RA that are provided on the semiconductor device DIE. In order to increase transmission efficiency between the at least one transmission antenna 130 on the probe card 10 and the reception antennas RA on the semiconductor device DIE, a K factor and a Q factor may need to be increased. In order to increase the K factor and the Q factor, respective sizes of the transmission antenna 130 and the reception antennas RA may need to be substantially similar.

However, as described above, since the reception antenna RA on each semiconductor device DIE is quite small, there is a limitation in reducing the size of the at least one transmission antenna 130 on the substrate 110 by using a general semiconductor manufacturing process. For example, since the size of the reception antenna RA is about tens to about hundreds of microns, the size of the at least one transmission antenna 130 may also be about tens to about hundreds of microns.

In order to form the at least one transmission antenna 130 to have a size of tens to hundreds of microns, spaces between coils that configure the at least one transmission antenna 130 need to be, for example, on the order of several microns. However, since a minimum width and a minimum space of a pattern that may be formed using general semiconductor manufacturing processes may only be tens of microns, it may be difficult or impossible to form the spaces between the coils that configure the at least one transmission antenna 130 to have spaces between the coils of several microns.

According to the present embodiment, the at least one transmission antenna 130 may be implemented as a COF type antenna and attached to a side of the substrate 110. When the at least one transmission antenna 130 is a COF type antenna, it is possible to form fine patterns having a size of several microns with low cost, and thus, the size of the at least one transmission antenna 130 may be substantially similar to the size of the reception antennas RA. The at least one transmission antenna 130 that is implemented as a COF type antenna will be described in detail with reference to FIG. 8.

Although not illustrated, the probe card 10 may further include a transmission circuit which may receive the electrical signal, i.e., at least one of an electrical power signal and a data signal, from the tester 30, perform signal processing on at least one of the received electrical power and/or the received data, and then transmit at least one of the processed electrical power and the processed data to the at least one transmission antenna 130. According to an aspect of the inventive concepts, the transmission circuit may be implemented as a COF type and attached to the substrate 110.

The probe unit 150 may be attached to a side of the substrate 110, and may transmit the electrical signal received from the tester 30 to each semiconductor device DIE by wired connections. The probe unit 150 may include a plurality of pads 151 and a plurality of probes 153. The probes 153 may contact the respective chip pads CP of each semiconductor device DIE, and transmit the electrical signal, i.e., at least one of an electrical power signal and a data signal, that is received from the tester 30 to the chip pads CP by wired connections. The probes 153 may be disposed near the at least one transmission antenna 130. According to an aspect of the inventive concepts, the probe unit 150 may be removed from the probe card 10 after a test is finished.

The test chamber 20 provides a space for testing electrical properties of the semiconductor device DIE. A wafer supporting chuck 200 that supports the wafer W may be disposed in the test chamber 20. The wafer supporting chuck 200 may support and raise and lower the wafer W.

In particular, when a wafer W to be tested is disposed at a predetermined location during a test, the wafer supporting chuck 200 may raise the wafer W such that the wafer W and the at least one transmission antenna 130 on the probe card 10 are located within a predetermined distance. Alternatively, when the wafer W to be tested is disposed at a predetermined location during the test, the wafer supporting chuck 200 may raise the wafer W such that the plurality of probes 153 on the probe card 10 and the plurality of chip pads CP of each semiconductor device DIE on the wafer W may contact each other. When the test is finished, the wafer supporting chuck 200 may lower the wafer W.

A first side of the probe card 10, on which the at least one transmission antenna 130 and the plurality of probes 153 are provided, is disposed such that the first side of the probe card 10 faces an open portion of the test chamber 20. In the test chamber 20, the wafer W is disposed on the wafer supporting chuck 200 such that the wafer W faces the probe card 10. When the wafer W is provided on the wafer supporting chuck 200, by using a flat zone of the wafer W, the chip pads CP of each semiconductor device DIE may be arrayed in an array direction of the probes 153 of the probe card 10 or in an array direction of the at least one transmission antenna 130.

When the chip pads CP of each semiconductor device DIE are arrayed below the probes 153 of the probe card 10 an a vertical direction, the chip pads CP of each semiconductor device DIE on the wafer W may physically and electrically contact the respective probes 153 of the probe card 10 as the wafer supporting chuck 200 is vertically raised and lowered. Also, the reception antenna RA on each semiconductor device DIE may be located within a predetermined distance from the at least one transmission antenna 130 of the probe card 10. Therefore, the reception antennas RA may wirelessly transmit and receive at least one of electrical power and data.

The test head 300 may include a test head board 310 and a base 330. The test head board 310 configures a body of the test head 300, and may be shaped as a flat quadrilateral with inclinations at its sides in which a lower area is smaller than an upper area. However, a shape of the test head board 310 is not limited thereto. For example, the test head board 310 may be shaped as a regular flat quadrilateral plate with upper and lower areas of the same size, or a flat circular plate.

The base 330 is disposed at a lower surface of the test head board 310, and may have a ring shape in which the center is vacant. The probe card 10 may be coupled to a lower surface of the base 330. A structure of the base 330 may vary according to a shape of the probe card 10.

The test body 350 may generate an electrical signal for testing the semiconductor devices DIE, and may transmit the electrical signal to each semiconductor device DIE on the wafer W via the test head 300 and the probe card 10. Also, the test body 350 may receive output signals, which are output from each semiconductor device DIE in response to the electrical signal transmitted to each semiconductor device DIE, via the probe card 10 and the test head 300, and thus determine whether or not the semiconductor devices DIE are faulty.

The loader chamber 40 is a space for storing the wafer W to be tested. In order to be tested, wafers W stored in the loader chamber 40 may be transferred one by one to the wafer supporting chuck 200 of the test chamber 20 by a moving device (not shown).

Figure 8:
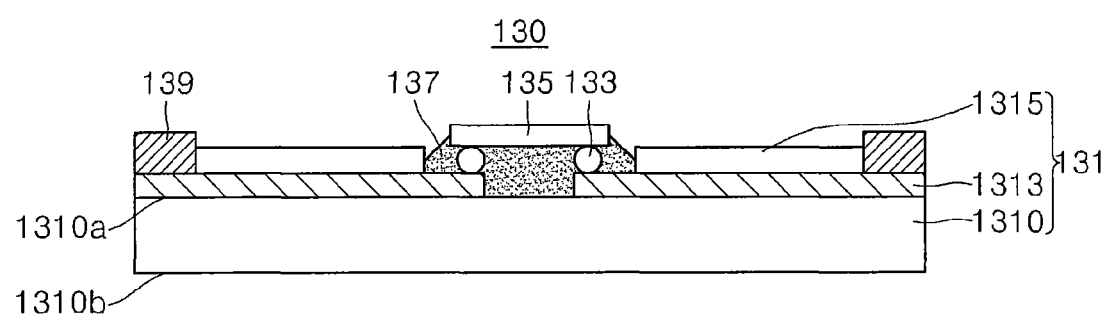
FIG. 8 is a cross-sectional view of a transmission antenna that is included in the probe card of FIG. 7, according to an aspect of the inventive concepts.

FIG. 8 is a cross-sectional view of a transmission antenna 130 that is included in the probe card 10 of FIG. 7, according to an aspect of the inventive concepts.

Referring to FIG. 8, the transmission antenna 130 may include a tape wiring substrate 131, and at least one coil 135 that is disposed at a side of the tape wiring substrate 131. The tape wiring substrate 131 may include a base film 1310, a wiring pattern 1313, and a protection layer 1315.

The base film 1310 is insulative and flexible, and may include, for example, a resin film such as polyimide. The base film 1310 includes an upper surface 1310a and a lower surface 1310b. A side at which the at least one coil 135 is disposed is the upper surface 1310a, and the opposite side is the lower surface 1310b.

The wiring pattern 1313 may be formed on the upper surface 1310a of the base film 1310. The wiring pattern 1313 may comprise a conductive material such as copper, aluminum, and titanium.

The protection layer 1315 may be disposed on the wiring pattern 1313 and at least partially cover the wiring pattern 1313. According to exemplary embodiments, the protection layer 1315 may be formed using a flexible resin such as polyimide. The protection layer 1315 may not cover side edges of the wiring pattern 1313 so that side edges of the wiring pattern 1313 may be exposed. Connectors 139 may be disposed on the exposed sides of the wiring pattern 1313.

The at least one coil 135 may be disposed on the upper surface 1310a of the base film 1310. The number, size, and inductance of the at least one coil 135 may be determined according to the number, size, and inductance of the at least one reception antenna RA that corresponds to each semiconductor device DIE, respectively. In particular, similar to the size of the at least one reception antenna RA, the at least one coil 135 may be formed to have a size of on the order of several microns between adjacent coils.

One or more conductive bumps 133 may be disposed at both sides of the at least one coil 135, and the at least one coil 135 may be electrically connected to the wiring pattern 1313 via the conductive bumps 133. A lower portion of the at least one coil 135 may be filled with an underfill 137. The underfill 137 may include, for example, solder resist.

FIGS. 9A to 9D are plan views of example embodiments of the transmission antenna 130 that is included in the probe card 10 of FIG. 7.

Figure 9A:
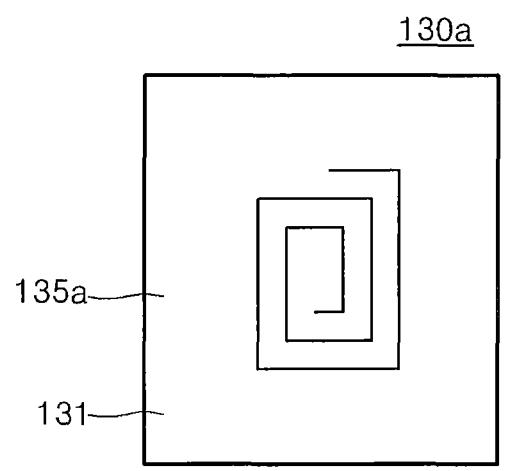
FIGS. 9A to 9D are plan views of examples of the transmission antenna that is included in the probe card of FIG. 7.

Referring to FIG. 9A, a transmission antenna 130a may include the tape wiring substrate 131, and at least one coil 135a that is disposed at a side of the tape wiring substrate 131. The at least one coil 135a may be formed as a quadrilateral. A shape of the at least one coil 135a may be determined according to a space in which at least one coil 135a is provided and/or a required inductance of the transmission antenna 130a. Also, a size of the transmission antenna 130a may be determined according to a size of the at least one reception antenna RA that corresponds to each semiconductor device DIE.

Figure 9B:
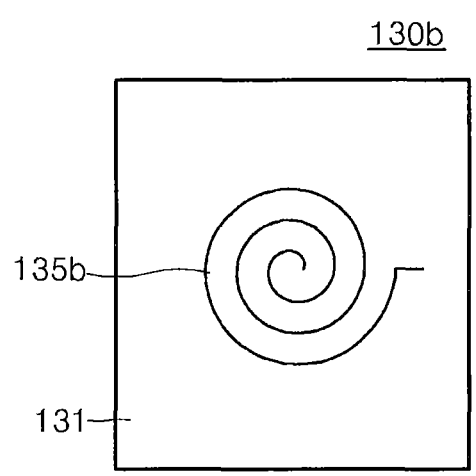

Referring to FIG. 9B, a transmission antenna 130b may include the tape wiring substrate 131, and at least one coil 135b that is disposed at a side of the tape wiring substrate 131. The at least one coil 135b may be formed as a circular shape. A shape of the at least one coil 135b may be determined according to a space in which at least one coil 135b is provided and/or a required inductance of the transmission antenna 130b. Also, a size of the transmission antenna 130b may be determined according to a size of the at least one reception antenna RA that corresponds to each semiconductor device DIE.

Figure 9C:
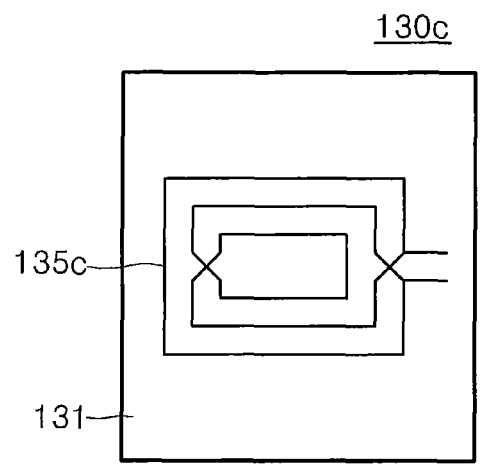

Referring to FIG. 9C, a transmission antenna 130c may include the tape wiring substrate 131, and at least one coil 135c that is disposed at a side of the tape wiring substrate 131. The at least one coil 135c may be formed as a multi-layered quadrilateral. A shape of the at least one coil 135c may be determined according to a space in which at least one coil 135c is provided and/or a required inductance of the transmission antenna 130c. Also, a size of the transmission antenna 130c may be determined according to a size of the at least one reception antenna RA that corresponds to each semiconductor device DIE.

Figure 9D:
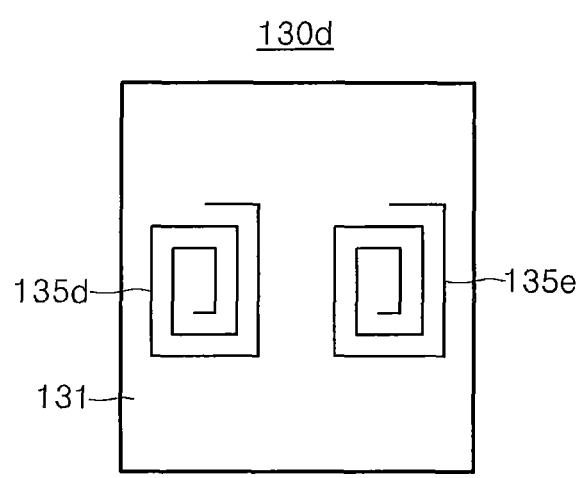

Referring to FIG. 9D, a transmission antenna 130d may include the tape wiring substrate 131, and a plurality of coils 135d and 135e that are disposed at a side of the tape wiring substrate 131. Although FIG. 9D illustrates two coils 135d and 135e, the inventive concepts are not limited thereto. The number of coils 135d and 135e may be determined according to the number of reception antennas RA that correspond to each semiconductor device DIE.

The size of the transmission antenna 130d may be determined according to the size of the at least one reception antenna RA that correspond to each semiconductor device DIE. Also, respective sizes of the plurality of coils 135d and 135e may vary, and be individually determined based on the size of the at least one reception antenna RA that corresponds to each semiconductor device DIE.

Figure 10:
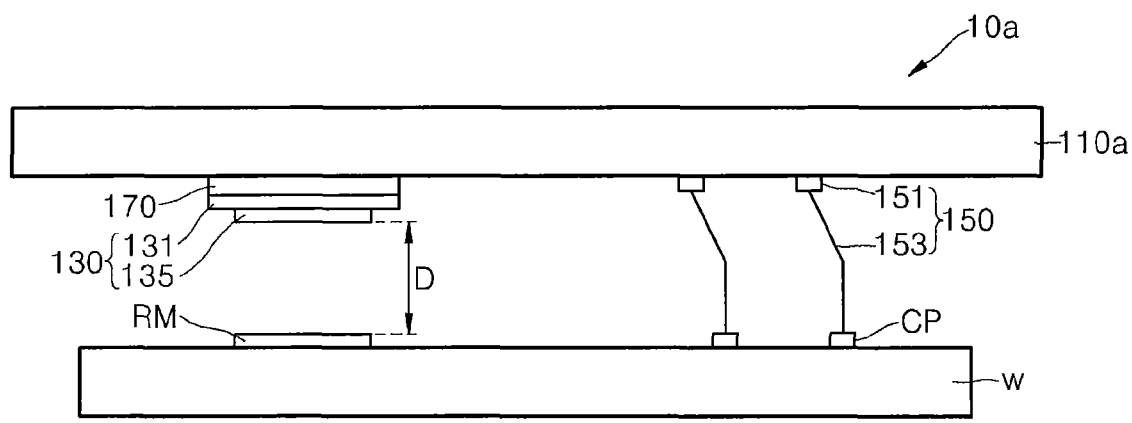
FIG. 10 is a cross-sectional view of an example embodiment of the probe card of FIG. 7.

FIG. 10 is a cross-sectional view of an example probe card 10a that may be used as the probe card 10 of FIG. 7.

Referring to FIG. 10, the probe card 10a may include a substrate 110a, the at least one transmission antenna 130, and the probe unit 150. The at least one transmission antenna 130 may include the tape wiring substrate 131 and the at least one coil 135 that is disposed at a side of the tape wiring substrate 131. The at least one transmission antenna 130 may be attached to a side of the substrate 110a by an adhesive 170. The probe unit 150 may include the plurality of pads 151 and the plurality of probes 153 that are connected to the respective pads 151.

During a test, a device under test (DUT), i.e., a wafer W that is to be tested, may be disposed under the probe card 10a. In particular, the reception module RM is disposed under the at least one transmission antenna 130 that is provided on the probe card 10a, and the chip pads CP may be disposed under the probe unit 150 that is provided on the probe card 10a. According to another aspect of the inventive concepts, instead of the reception module RM, the reception antenna RA may be disposed under the at least one transmission antenna 130 that is provided on the probe card 10a.

For smooth wireless communication between the at least one transmission antenna 130 and the reception module RM, a distance D between the at least one transmission antenna 130 and the reception module RM should be equal to or less than a predetermined distance. For example, the predetermined distance may be about 50 μm. To do so, the wafer supporting chuck 200 may raise the wafer W.

Figure 11:
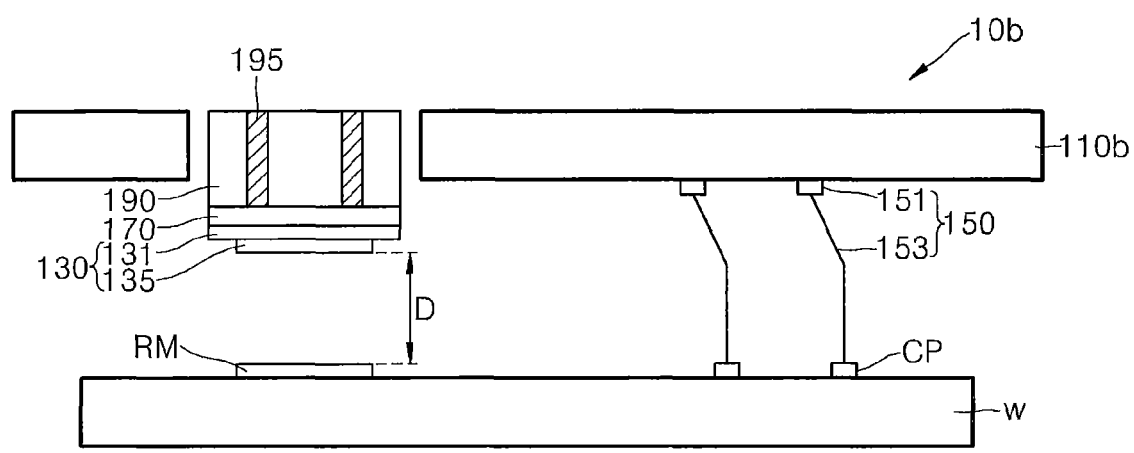
FIG. 11 is a cross-sectional view of another example embodiment of the probe card of FIG. 7.

FIG. 11 is a cross-sectional view of another example of a probe card 10b that may be used to implement the probe card 10 of FIG. 7.

Referring to FIG. 11, the probe card 10b may include a substrate 110b, the at least one transmission antenna 130, the probe unit 150, and a distance adjusting unit 190. Some elements included in the probe card 10b according to the present embodiment are substantially the same as the elements included in the probe card 10a of FIG. 10. Like elements are denoted by like reference numerals, and a description of elements that are the same as those of the probe card 10a of FIG. 10 will not be repeated. Hereinafter, a difference between the probe card 10a of FIG. 10 and the probe, card 10b according to the present embodiment will be described.

The distance adjusting unit 190 may be connected to the other side of the tape wiring substrate 131, and may adjust the distance D between the at least one transmission antenna 130 and the reception module RM to be, for example, about 50 μm or less. The distance adjusting unit 190 may include a plurality of via plugs 195 that are electrically connected to the at least one transmission antenna 130.

Figure 12:
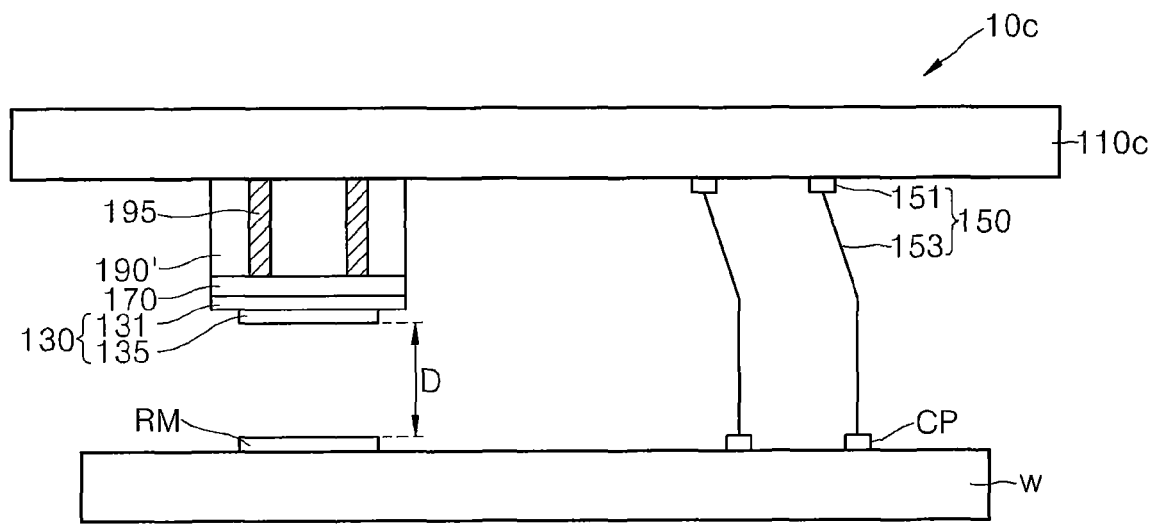
FIG. 12 is a cross-sectional view of yet another example embodiment of the probe card of FIG. 7.

FIG. 12 is a cross-sectional view of another probe card 10c that may be used to implement the probe card 10 of FIG. 7.

Referring to FIG. 12, the probe card 10c may include a substrate 110c, the at least one transmission antenna 130, the probe unit 150, and a distance adjusting unit 190'. Some elements included in the probe card 10c according to the present embodiment are substantially the same as the elements included in the probe card 10a of FIG. 10 or the probe card 10b of FIG. 11. Like elements are denoted by like reference numerals, and a description of elements that are the same as those of the probe card 10a of FIG. 10 or the probe card 10b of FIG. 11 will not be repeated. Hereinafter, a difference between the probe card 10a of FIG. 10 or the probe card 10b of FIG. 11 and the probe card 10c according to the present embodiment will be described.

The distance adjusting unit 190' is disposed between the substrate 110c and the at least one transmission antenna 130, and in particular, may be connected to the other side of the tape wiring substrate 131. The distance adjusting unit 190' may adjust the distance D between the at least one transmission antenna 130 and the reception module RM to be, for example, about 50 μm or less. The distance adjusting unit 190' may include the plurality of via plugs 195 that are electrically connected to the at least one transmission antenna 130.

Figure 13:
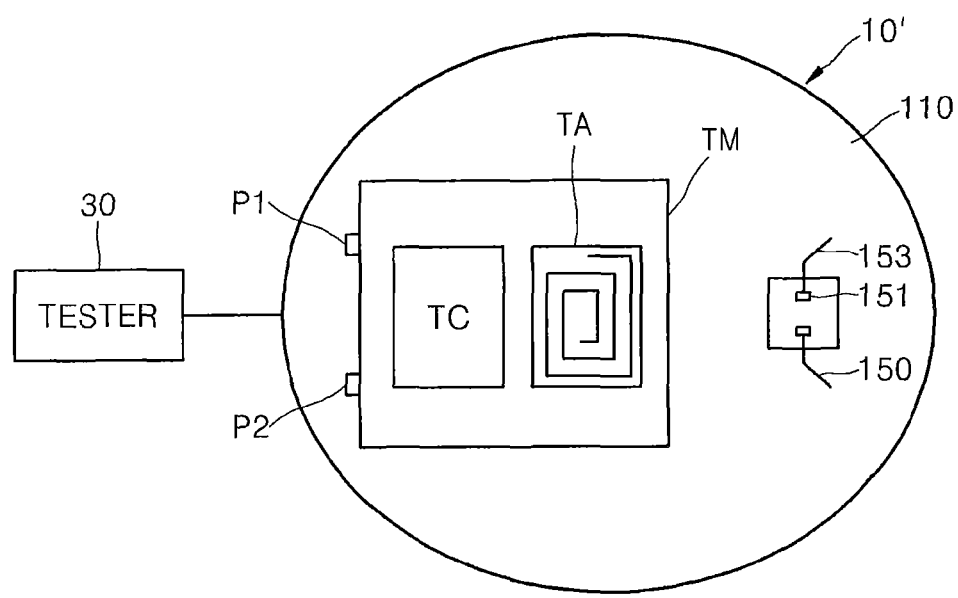
FIG. 13 is a schematic plan view of a modified example of a probe card that is included in the test system of FIG. 6, according to another aspect of the inventive concepts.

FIG. 13 is a schematic plan view of a modified example of the probe card 10 of FIG. 6, according to another aspect of the inventive concepts.

Referring to FIG. 13, a probe card 10' may include the substrate 110, at least one transmission module TM, and the probe unit 150. Some elements included in the probe card 10' according to the present embodiment are substantially the same as the elements included in the probe card 10 of FIG. 7. Like elements are denoted by like reference numerals, and a description of elements that are the same as those of the probe card 10 of FIG. 7 will not be repeated. Hereinafter, a difference between the probe card 10 of FIG. 7 and the probe card 10' according to the present embodiment will be described.

The at least one transmission module TM may include at least one transmission antenna TA and a transmission circuit TC. By implementing the transmission antenna TA and the transmission circuit TC as a small transmission module TM, the transmission antenna TA and the transmission circuit TC may be inserted in desired locations in the probe card 10'.

The at least one transmission antenna TA may be substantially similar to the transmission antenna 130 of FIG. 7. In particular, the at least one transmission antenna TA may be implemented as a COF type antenna and attached to a side of the substrate 110, and may wirelessly transmit an electric signal that is received from the tester 30 to each semiconductor device DIE.

The transmission circuit TC may also be implemented as a COF type and attached to a side of the substrate 110. The transmission circuit TC may process the electrical signal received from the tester 30, and transmit the processed electrical signal to the at least one transmission antenna TA. Also, the transmission circuit TC may be configured to perform bidirectional communication. Then, the transmission circuit TC may process an output signal received from the semiconductor device DIE, and transmit the processed output signal to the tester 30.

Figure 14:
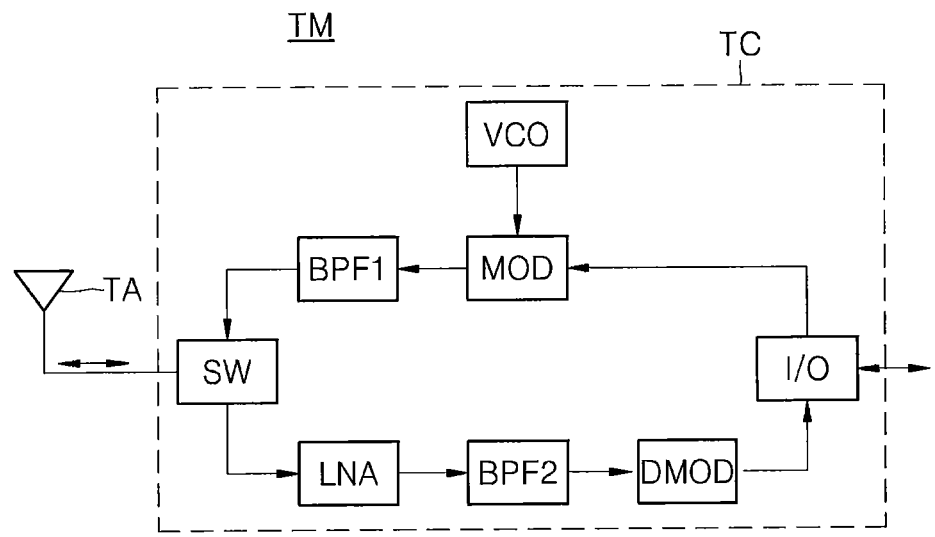
FIG. 14 is a schematic block diagram of an example of a transmission module that is included in the probe card of FIG. 13.

FIG. 14 is a schematic block diagram of an example of the at least one transmission module TM of FIG. 13.

Referring to FIG. 14, the at least one transmission module TM may include the at least one transmission antenna TA and the transmission circuit TC. The transmission circuit TC may be configured to perform bidirectional communication. In particular, the transmission circuit TC may include a switch SW, first and second band pass filters BPF1 and BPF2, a modulator MOD, a voltage-controlled oscillator VCO, a low-noise amplifier LNA, a de-modulator DMOD, and an I/O pad I/O. Since the elements included in the transmission circuit TC are similar to elements of a general transmission circuit, a detailed description of the transmission circuit TC will be omitted.

Figure 15:
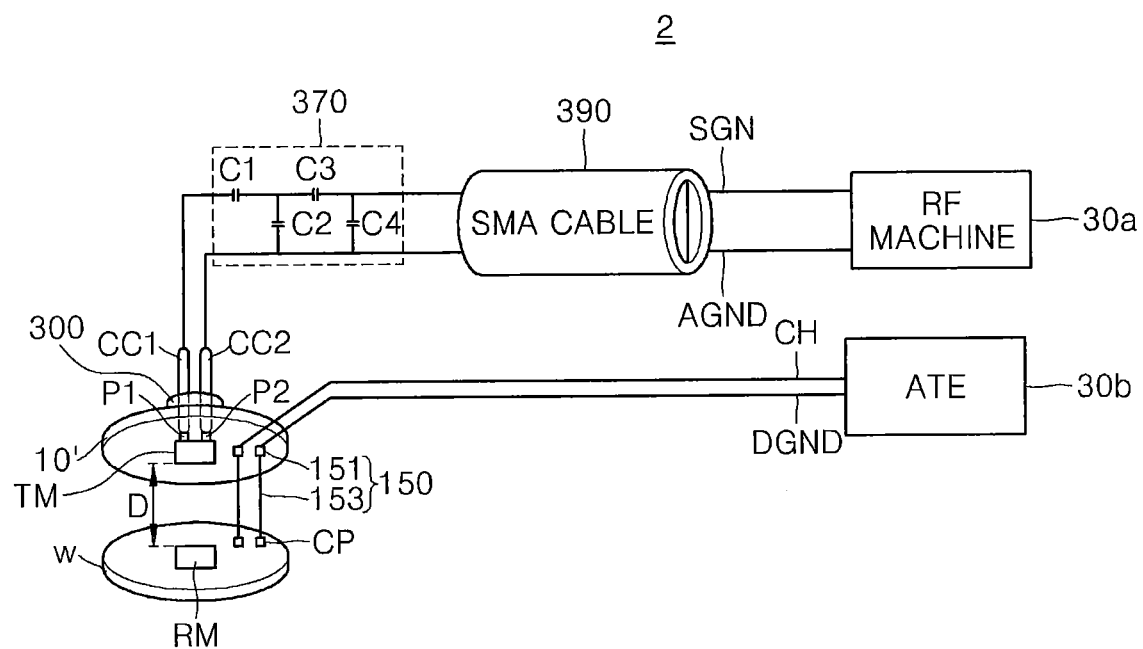
FIG. 15 is a test system according to another aspect of the inventive concepts.

FIG. 15 is a test system 2 according to another aspect of the inventive concepts.

Referring to FIG. 15, the test system 2 may include the probe card 10', a wafer W to be tested, a first tester 30a, and a second tester 30b. Some elements included in the test system 2 according to the present embodiment are substantially the same as the elements included in the test system 1 of FIG. 6. Like elements are denoted by like reference numerals, and a description of elements that are the same as those of the test system 1 of FIG. 6 will not be repeated. Hereinafter, a difference between the test system 1 of FIG. 6 and the test system 2 according to the present embodiment will be described.

The probe card 10' may include the substrate 110, a transmission module TM, and the probe unit 150. The transmission module TM may be connected to the first tester 30a, and the probe unit 150 may be connected to the second tester 30b. For example, the first tester 30a may be a radio frequency (RF), and the second tester 30b may be automatic test equipment (ATE). In some embodiments, the probe card 10' may include the at least one transmission antenna 130 and the transmission circuit TC, instead of the transmission module TM.

A signal line SGN and a ground line AGND of the first tester 30a may pass through an SMA cable 390 and an impedance matching unit 370, and thus be connected to coaxial cables CC1 and CC2. The coaxial cables CC1 and CC2 may be electrically connected to respective connection pads P1 and P2 of the transmission module TM that is provided on the probe card 10'. The impedance matching unit 370 may include a plurality of capacitors C1, C2, C3, and C4.

When a distance between the probe card 10' and the wafer W is equal to or less than a predetermined distance, for example, about 50 μm, the transmission module TM provided on the probe card 10' may wirelessly transmit an electrical signal that is generated by the first tester 30a to the reception module RM provided on the wafer W.

A channel line CH and a ground line DGND of the second tester 30b may be connected to respective ones of the pads 151 of the probe unit 150 on the probe card 10'. The probes 153 may contact respective ones of the chip pads CP that correspond to each semiconductor device DIE on the wafer W, and receive an output signal that is output from each semiconductor device DIE in response to the electrical signal that is generated by the first tester 30a or the second tester 30b.

As described above, according to embodiments of the inventive concepts, an antenna that is implemented as a CQF type antenna may be applied to various apparatuses. For example, the antenna that is implemented as a COF type antenna may be included in an integrated circuit (IC), and be used in smartcards or for near field communication (NFC).

While the inventive concepts have been particularly shown and described with reference to exemplary embodiments thereof, it will be understood that various changes in form and details may be made therein without departing from the spirit and scope of the following claims.

What is claimed is:

1. A probe card for testing electrical properties of a device under test that includes a plurality of semiconductor devices, the probe card comprising:
    a substrate;
    at least one transmission antenna, which is implemented as a chip on film (COF) type and attached to the substrate, the at least one transmission antenna configured to wirelessly transmit at least one of an electrical power signal and a data signal to each of the plurality of semiconductor devices, wherein the at least one transmission antenna comprises a tape wiring substrate and at least one coil disposed at a first side of the tape wiring substrate;
    a distance adjusting unit which is connected to a second side of the tape wiring substrate that is opposite the first side, wherein the distance adjusting unit is configured to adjust a distance between the at least one transmission antenna and the device under test,
    wherein the distance adjusting unit comprises a plurality of via plugs that are electrically connected to the at least one transmission antenna.

2. The probe card of claim 1, wherein a size of the at least one transmission antenna is determined according to a size of at least one reception antenna on the device under test.

3. The probe card of claim 1, wherein the at least one transmission antenna comprises a first number of transmission antennas, and wherein each of the plurality of semiconductor devices includes the first number of reception antennas.

4. The probe card of claim 1, wherein the at least one transmission antenna is configured to wirelessly transmit the at least one of the electrical power signal and the data signal to a plurality of reception antennas that are provided on respective ones of the plurality of semiconductor devices.

5. The probe card of claim 4, wherein a size of the at least one coil is determined based on a size of each of the plurality of reception antennas.

6. The probe card of claim 1, further comprising a transmission circuit, which is implemented as a COF type and attached to the substrate, wherein the transmission circuit is configured to receive at least one of a test electrical power signal and a test data signal from a tester and to perform signal processing on the received at least one of the test electrical power signal and the test data signal to generate at least one of the electrical power signal and the data signal that are wirelessly transmitted by the at least one transmission antenna.

7. The probe card of claim 1, further comprising a probe unit that is provided on the substrate,
    wherein the probe unit includes a plurality of probes that are configured to contact the device under test during an electrical properties test, and wherein the probes of the probe unit are configured to receive output signals that are output from at least one of the plurality of semiconductor devices in response to the at least one of the electrical power signal and the data signal.

8. The probe card of claim 7, wherein a first of the plurality of probes is configured to contact a chip pad on a first of the plurality of semiconductor devices to transmit at least one of the electrical power signal and the data signal to the first of the plurality of semiconductor devices.

9. The probe card of claim 1 in combination with a tester that is configured to provide the at least one of a test electrical power signal and a test data signal to the probe card for testing electrical properties of the device under test to provide a test system.

10. The probe card of claim 9, wherein the at least one transmission antenna comprises:
    a tape wiring substrate; and
    at least one coil disposed at a first side of the tape wiring substrate.

11. The probe card of claim 10, wherein the probe card further comprises a probe unit that is provided on the substrate, and
    wherein the probe unit comprises a plurality of probes that are configured to contact the device under test during an electrical properties test, and wherein a probe of the probe unit is configured to receive an output signal that is output from at least one of the plurality of semiconductor devices in response to the at least one of the electrical power signal and the data signal.

12. A probe card for testing electrical properties of a device under test that includes a plurality of semiconductor devices that each include at least one reception antenna, the probe card comprising:
    a substrate;
    at least one chip on film type transmission antenna on the substrate, the at least one chip on film transmission antenna configured to wirelessly transmit at least one of an electrical power signal and a data signal to the at least one reception antenna on each of the plurality of semiconductor devices;

a moveable distance adjusting unit, wherein the at least one chip on film transmission antenna is mounted on the moveable distance adjusting unit, and wherein the moveable distance adjusting unit comprises a plurality of via plugs that are electrically connected to the at least one chip on film transmission antenna; and a plurality of probes that are connected to the substrate and that are configured to contact the device under test during an electrical properties test, wherein each of the at least one chip on film transmission antennas is substantially the same size as each of the at least one reception antennas.

13. The probe card of claim 12, wherein the at least one chip on film transmission antennas comprises a first number of antennas that is at least two antennas, and wherein the at least one reception antenna included on each of the semiconductor devices comprises the first number of reception antennas.

14. The probe card of claim 12, wherein the at least one chip on film transmission antenna comprises:
a tape wiring substrate; and
at least one coil disposed at a first side of the tape wiring substrate.

15. The probe card of claim 14, wherein the tape wiring substrate comprises an insulating base film, a wiring pattern on the insulating base film, a protective film on the wiring pattern, and the at least one coil electrically connected to the wiring pattern.

16. The probe card of claim 12, wherein the at least one reception antenna is located in at least one scribe line of the device under test.

* * * * *